(12) United States Patent
Hantschel et al.

(10) Patent No.: US 9,681,563 B2
(45) Date of Patent: Jun. 13, 2017

(54) INSERT CASING FOR FASTENING AN ELECTRICAL COMPONENT

(71) Applicant: Würth Elektronik eiSos GmbH & Co. KG, Waldenburg (DE)

(72) Inventors: Jörg Hantschel, München (DE); Robert Frank, Untermeitingen (DE)

(73) Assignee: WÜRTH ELEKTRONIC EISOS GMBH & CO. KG, Waldenburg (DE)

( * ) Notice: Subject to any disclaimer, the term of this patent is extended or adjusted under 35 U.S.C. 154(b) by 182 days.

(21) Appl. No.: 14/643,568

(22) Filed: Mar. 10, 2015

(65) Prior Publication Data
US 2015/0264827 A1  Sep. 17, 2015

(30) Foreign Application Priority Data

Mar. 12, 2014 (EP) .................................. 14159153

(51) Int. Cl.
| A47F 5/08 | (2006.01) |
| H05K 5/02 | (2006.01) |
| A47B 97/00 | (2006.01) |
| H02G 3/12 | (2006.01) |
| H02G 3/18 | (2006.01) |
| H05K 5/00 | (2006.01) |

(52) U.S. Cl.
CPC .......... *H05K 5/0217* (2013.01); *A47B 97/00* (2013.01); *H02G 3/121* (2013.01); *H02G 3/185* (2013.01); *H05K 5/0091* (2013.01); *H05K 5/0247* (2013.01); *Y10T 29/49876* (2015.01)

(58) Field of Classification Search
USPC ..................................................... 248/231.9
See application file for complete search history.

(56) References Cited

U.S. PATENT DOCUMENTS

| 5,460,542 | A | * | 10/1995 | Castellani | ............ | H01R 25/006 |
| | | | | | | 439/535 |
| 6,015,307 | A | | 1/2000 | Chiu et al. | | |
| 6,024,599 | A | * | 2/2000 | Stathis | .................. | H01R 13/60 |
| | | | | | | 174/480 |
| 6,089,921 | A | | 7/2000 | Chou | | |
| 7,255,325 | B2 | | 8/2007 | Muderlak | | |

(Continued)

FOREIGN PATENT DOCUMENTS

| DE | 10119910 | 8/2002 |
| DE | 102008014382 B3 | 6/2009 |

(Continued)

OTHER PUBLICATIONS

European Search Report, Nov. 9, 2014, 5 pages.
Examination report issued on May 13, 2016 for Australian Patent Application No. 2015200659.

*Primary Examiner* — Monica Millner
(74) *Attorney, Agent, or Firm* — Reising Ethington P.C.

(57) ABSTRACT

An insert casing for receiving and fastening an electrical or electronic component includes a first casing part which is connectable to a second casing part by means of a rotary joint. The casing parts define a receiving space for the electrical or electronic component. The first casing part is provided with at least one spreading member which is spreadable by the second casing part when the rotary joint is being closed. The insert casing can be fastened easily in a recess of an object by closing the rotary joint.

21 Claims, 8 Drawing Sheets

(56) References Cited

U.S. PATENT DOCUMENTS

| | | | | |
|---|---|---|---|---|
| 7,635,110 | B2* | 12/2009 | Galasso | H02G 3/185 174/483 |
| 7,806,723 | B2* | 10/2010 | Chong | H02G 3/22 439/571 |
| 8,317,537 | B1* | 11/2012 | Black | A47B 21/06 439/142 |
| 8,475,186 | B1* | 7/2013 | Sikkema | H01R 13/447 439/131 |
| 8,598,453 | B2* | 12/2013 | Hsiao | H02G 3/185 174/481 |
| 9,024,211 | B2* | 5/2015 | Stathis | H02G 3/0406 16/2.1 |
| 9,148,007 | B2* | 9/2015 | Drane | H02G 3/185 |
| 2002/0104672 | A1* | 8/2002 | Krupa, Jr. | G01R 11/04 174/58 |
| 2006/0065420 | A1* | 3/2006 | Roesch | H02G 3/185 174/481 |
| 2008/0053679 | A1 | 3/2008 | Galasso et al. | |
| 2008/0054135 | A1 | 3/2008 | Galasso et al. | |

FOREIGN PATENT DOCUMENTS

| | | |
|---|---|---|
| EP | 1916751 A1 | 4/2008 |
| EP | 2164143 A2 | 3/2010 |
| JP | 20000116444 A | 4/2000 |
| TW | I338734 B | 3/2011 |

* cited by examiner

INSERT CASING FOR FASTENING AN ELECTRICAL COMPONENT

CROSS-REFERENCE TO RELATED APPLICATIONS

This application claims the priority of Patent Application Serial No. EP 14 159 153.7 filed on 12 Mar. 2014, pursuant to 35 U.S.C. 119(a)-(d), the content of which is incorporated herein by reference in its entirety as if fully set forth herein.

FIELD

The device relates to an insert casing for receiving and fastening an electrical component comprising a first casing part and a second casing part connectable to the first casing part, and a receiving space defined by the casing parts for receiving an electrical component. The device further relates to an object, in particular a piece of furniture, comprising an insert casing of this type. The device further relates to a method for fastening an insert casing of this type to an object.

BACKGROUND ART

An insert casing for mounting an electrical device in a floor recess is known from US 2008/054 135 A1. The insert casing comprises a bracket having flexible retaining legs provided with barbs for securing the casing in the floor recess. When a cover is placed thereupon, the retaining legs comprising the barbs are spread outwardly so that the casing is securely fastened in the floor recess by means of the barbs. The drawback of said insert casing is that it has a complex design and is difficult to mount and dismount.

SUMMARY OF THE DEVICE

An object is to provide an insert casing for receiving and fastening an electrical component which has a simple design and is easy to mount and dismount.

This object is achieved by an insert casing for receiving and fastening an electrical component comprises a first casing part and a second casing part connectable to the first casing part, and a receiving space defined by the casing parts for receiving an electrical component, wherein the casing parts form a rotary joint, at least one spreading member is arranged at the first casing part, and the at least one spreading member is spreadable by the second casing part when the rotary joint is closed. The casing parts defining the receiving space for the electrical component form a rotary joint such that they are connectable by closing the rotary joint and releasable by opening the rotary joint. Due to the fact that the first casing part is provided with at least one spreading member which is adapted to be spread by the second casing part when closing the rotary joint, the second casing part is connected to the first casing part simply by closing the rotary joint while the at least one spreading member is at the same time spread, in other words deflected radially, thus providing a simple manner of bracing and fastening the insert casing in an associated recess. The resulting insert casing has a simple design and can be fastened easily and securely.

In order to dismount the insert casing, the rotary joint is opened, causing the bracing, in other words the fastening, of the insert casing in the associated recess to be released. As a result, the insert casing is easily dismountable as well.

The rotary joint is in particular selected from the group comprising threaded joints and bayonet joints. Preferably, the casing parts form an internal thread and an associated external thread, thus allowing the casing parts to be screwed together. Preferably, the internal thread is provided at the first casing part while the external thread is provided at the second casing part.

An insert casing wherein the first casing part has an annular side wall with a central longitudinal axis, and wherein the at least one spreading member is arranged at the side wall and is spreadable radially relative to the central longitudinal axis has a simple design and is easily mountable. Due to the fact that the at least one spreading member is arranged at the annular side wall of the first casing part, said spreading member is easily spreadable, in other words deflectable, radially in the direction of the central longitudinal axis by turning the second casing part about the central longitudinal axis relative to the first casing when closing the rotary joint. Preferably, the first casing part has a casing bottom to which the annular side wall is secured. Preferably, the casing bottom and the side wall are formed in one piece.

An insert casing wherein the at least one spreading member is arranged in one piece and/or resiliently at the first casing part has a simple design. Forming the at least one spreading member in one piece with the first casing part facilitates production of the insert casing and provides a simple manner of producing a resilient assembly. A resilient assembly allows the insert casing to be dismounted easily as the at least one spreading member reverts back to its non-spread position automatically when opening the rotary joint.

An insert casing wherein the at least one spreading member has a first end arranged at the first casing part and a free second end, and wherein the at least one spreading member has a wall thickness that increases radially in the direction of the second end can easily be provided with the at least one spreading member. The at least one spreading member has a wall thickness that increases in the radial direction such that the at least one spreading member protrudes into the receiving space in the non-spread position. When closing the rotary joint, the at least one spreading member is pushed out of the receiving space by the second casing part, causing the at least one spreading member to be deflected in the radial direction. In the deflected or spread position, the at least one spreading member protrudes beyond the outer circumference of the first casing part such that the insert casing is braced and fastened in the associated recess.

An insert casing wherein the at least one spreading member has an inner wall with an inner radius $r_S$ facing the receiving space, and wherein the inner radius $r_S$ tapers in the direction of a free end of the at least one spreading member is easily mountable and dismountable. The at least one spreading member has an inner radius $r_S$ that tapers in the direction of the free end thereof such that the at least one spreading member protrudes into the receiving space when in the non-spread position. When closing the rotary joint, the at least one spreading member is pushed out of the receiving space by the second casing part, causing the at least one spreading member to be deflected in the radial direction. In the deflected or spread position, the at least one spreading member protrudes beyond the outer circumference of the first casing part such that the insert casing is braced and fastened in the associated recess.

An insert casing wherein the at least one spreading member has an outer wall with an outer radius $R_S$ remote from the receiving space, and wherein the outer radius $R_S$ corresponds to an outer radius $R_G$ of the side wall is easily mountable and dismountable. Due to the fact that, in the non-spread position of the spreading member, the outer radius $R_S$ of the at least one spreading member corresponds to the outer radius $R_G$ of the first casing part, the insert casing is easily insertable into and removable from the recess. When the at least one spreading member is spread by closing the rotary joint, the at least one spreading member protrudes beyond the outer circumference of the first casing part such that the insert casing is braced in the recess. As the outer radius $R_S$ corresponds to the outer radius $R_G$, the bracing extends across a large surface area of the recess.

An insert casing wherein the at least one spreading member is provided with a profile at an outer wall remote from the receiving space for fastening the first casing part in a recess of an object can be fastened easily and securely. The profile provided at the outer wall of the at least one spreading member improves the connection with the object forming the receiving space.

An insert casing wherein the profile comprises ribs running around the central longitudinal axis can be fastened easily and securely. The ribs extending in the circumferential direction effectively prevent the insert casing from moving in the direction of the central longitudinal axis.

An insert casing wherein at least two spreading members and in particular at least three spreading members are arranged at the first casing part, wherein the spreading members are in particular arranged around the central longitudinal axis such as to be evenly spaced from each other can be fastened easily and securely. The plurality of spreading members increases the outer circumference of the first casing part in different radial directions, thus allowing the insert casing to be evenly and securely fastened in the recess.

An insert casing wherein the casing parts have at least one stop and an associated counter-stop for stopping a rotary movement of the casing parts relative to each other when the at least one spreading member is spread open is easily mountable. Due to the fact that the casing parts form at least one stop and an associated counter-stop, the rotary movement is stopped easily when the at least one spreading member reaches its spread position. This prevents an excess rotation of the casing parts and, consequently, a movement of the at least one spreading member from an intended spread position to an unintended non-spread position.

An insert casing wherein the second casing part has at least one contact member for spreading the at least one spreading member, a length $L_A$ of the at least one contact member relative to a length $L_S$ of the at least one spreading member in particular being such that $L_A/L_S \geq 0.5$, in particular $L_A/L_S \geq 0.6$, and in particular $L_A/L_S \geq 0.7$, can be fastened easily and securely. The at least one contact member ensures that the at least one spreading member is securely spread especially across a large surface area.

An insert casing wherein at least one of the casing parts is provided with a tool engagement member which is in particular arranged concentrically to the central longitudinal axis is easily mountable and dismountable. The tool engagement member provides a simple manner of opening and closing the rotary joint, and therefore a simple manner of spreading and releasing the at least one spreading member. The tool engagement member is in particular configured as a recess in one of the casing parts. The tool engagement member is preferably provided at the second casing part.

An insert casing wherein at least one of the casing parts has at least one through-opening into the receiving space, wherein the at least one through-opening is in particular formed in the casing part with the tool engagement member, is easily mountable and dismountable. Cable connections for the electrical or electronic component (to be) arranged in the receiving space are easily guidable into the receiving space via the at least one through-opening without interfering with the mounting or dismounting of the insert casing. The at least one through-opening is preferably formed in the casing part which is also provided with the tool engagement member. As a result, said casing part, which is exposed because of the tool engagement member, can at the same time be used for leading the cable connections in or out via the at least one through opening. Preferably, the at least one through-opening and the tool engagement member are formed in the second casing part.

Another object is to provide an object, in particular a piece of furniture, which allows an electrical or electronic component to be fastened easily and securely.

This object is achieved by an object, in particular a piece of furniture, comprises a base body and a recess formed in the base body, wherein an insert casing according to the invention is fastened in the recess. The base body is provided with a recess the shape and size of which correspond to the insert casing. The at least one spreading member allows the insert casing to be braced easily in the at least one recess. As a result, an electrical or electronic component arranged in the receiving space is easily and quickly mountable to and dismountable from the base body. Preferably, the electrical or electronic component is adapted for the wireless charging of mobile phones. The recess is configured as a through-hole or as a blind hole.

Another object of the invention is to provide a method which allows an insert casing to be easily and securely fastened to an object.

This object is achieved by a method for fastening an insert casing to an object, the method comprises the following steps: providing an insert casing according to the invention, arranging the first casing part in a recess of an object, in particular a piece of furniture, and connecting the second casing part with the first casing part by closing the rotary joint, wherein the second casing part spreads the at least one spreading member and fastens the insert casing in the recess. The advantages of the method according to the invention correspond to the above-described advantages of the insert casing according to the invention. The method according to the invention can in particular be further developed such as to have the features of the insert casing and of the object according to the invention. In a first step, the first casing part is arranged in the recess of the object. The receiving space in which the electrical or electronic component is disposed is then closed by means of the second casing part. To this end, the casing parts are interconnected by closing the rotary joint, causing the second casing part to be spread by the at least one spreading member such that the first casing part can be mounted in the recess of the object together with the second casing part connected thereto. When the rotary joint is closed, the insert casing is at the same time closed and braced in the recess. In order to dismount the insert casing, the rotary joint is opened so that the bracing provided by the at least one spreading member is released.

Further features, advantages and details of the invention will be apparent from the ensuing description of several exemplary embodiments.

DESCRIPTION OF THE PREFERRED EMBODIMENTS

Figure 1:
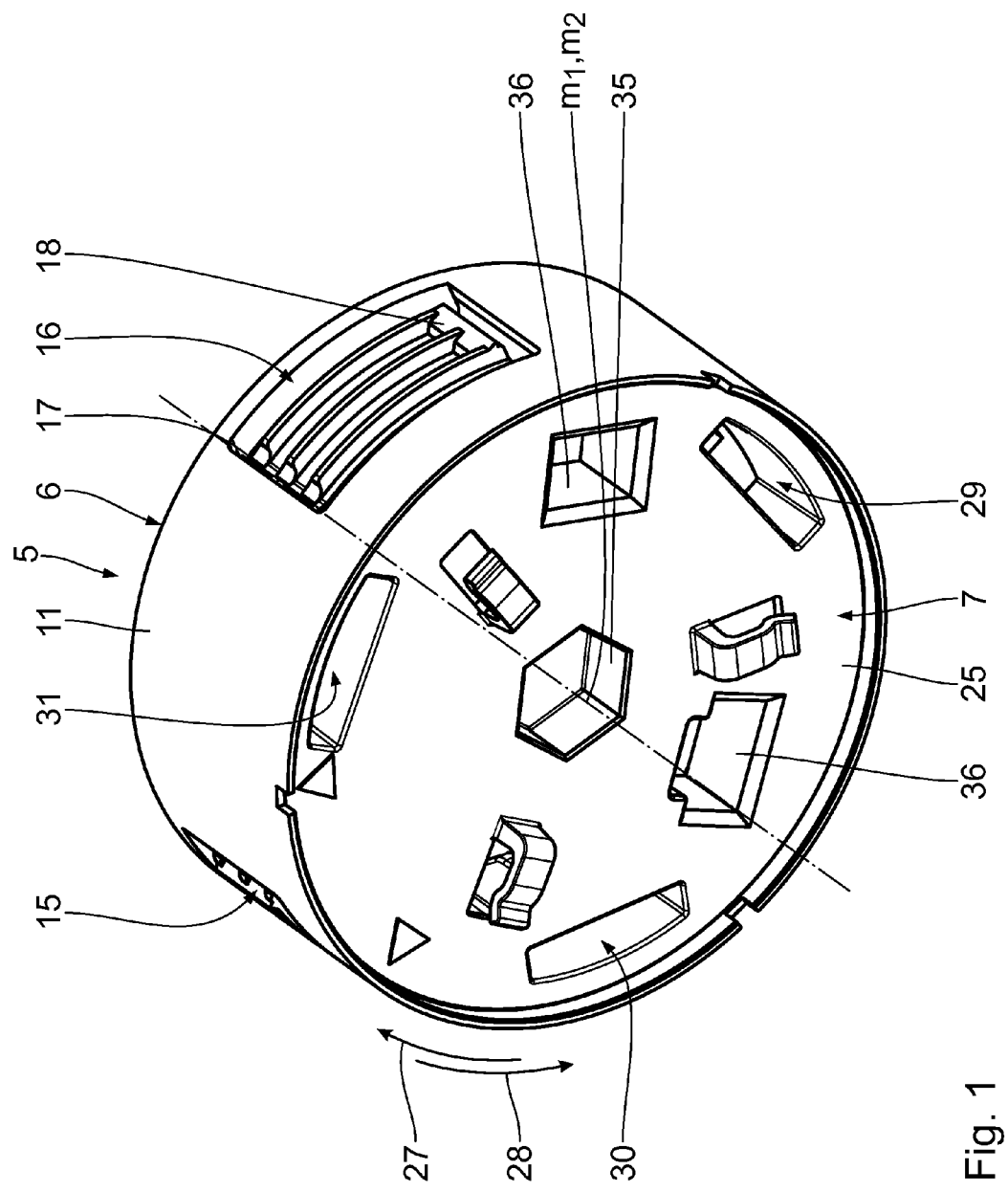
FIG. 1 shows a perspective view of an insert casing for receiving and fastening an electrical component according to a first exemplary embodiment.
Figure 2:
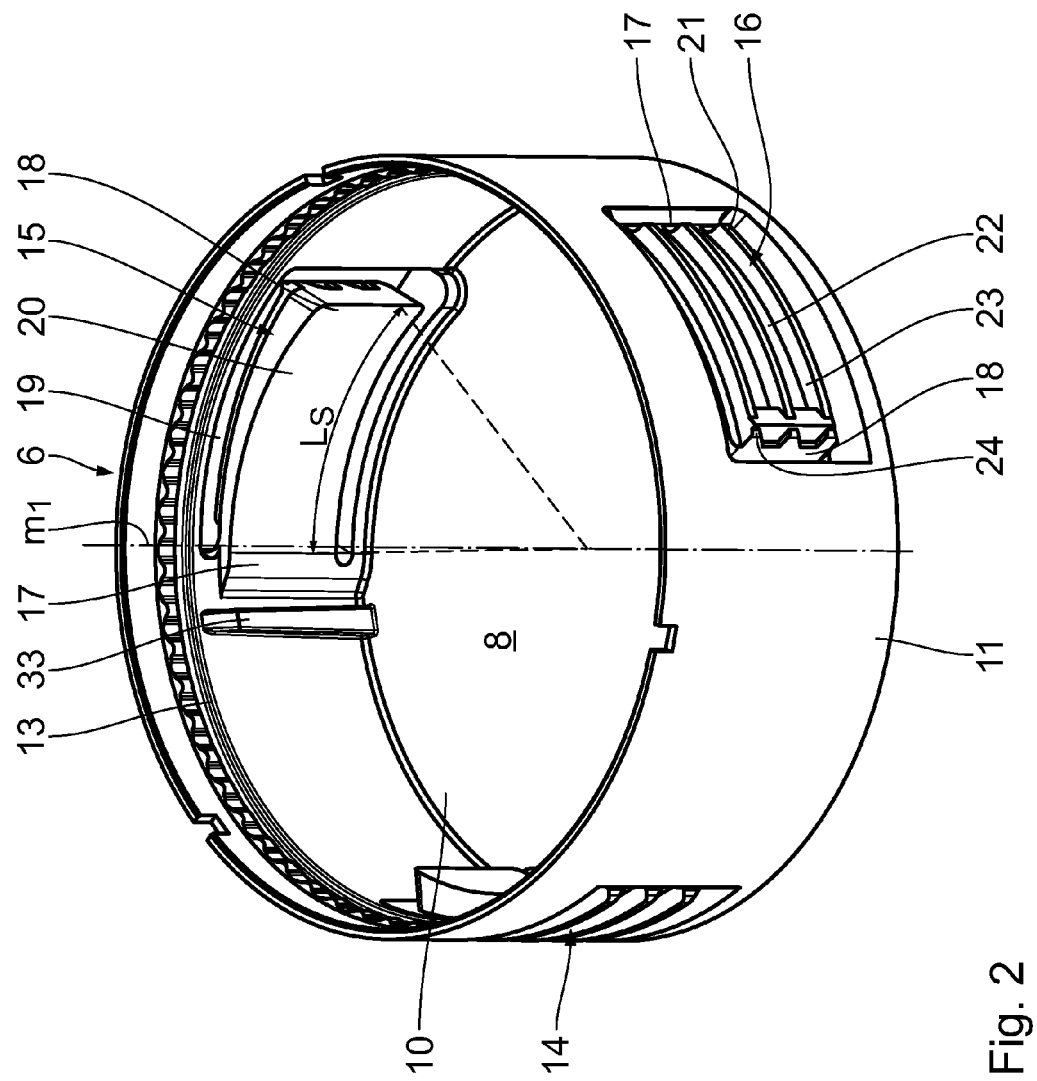
FIG. 2 shows a perspective view of a first casing part of the insert casing in FIG. 1.
Figure 3:
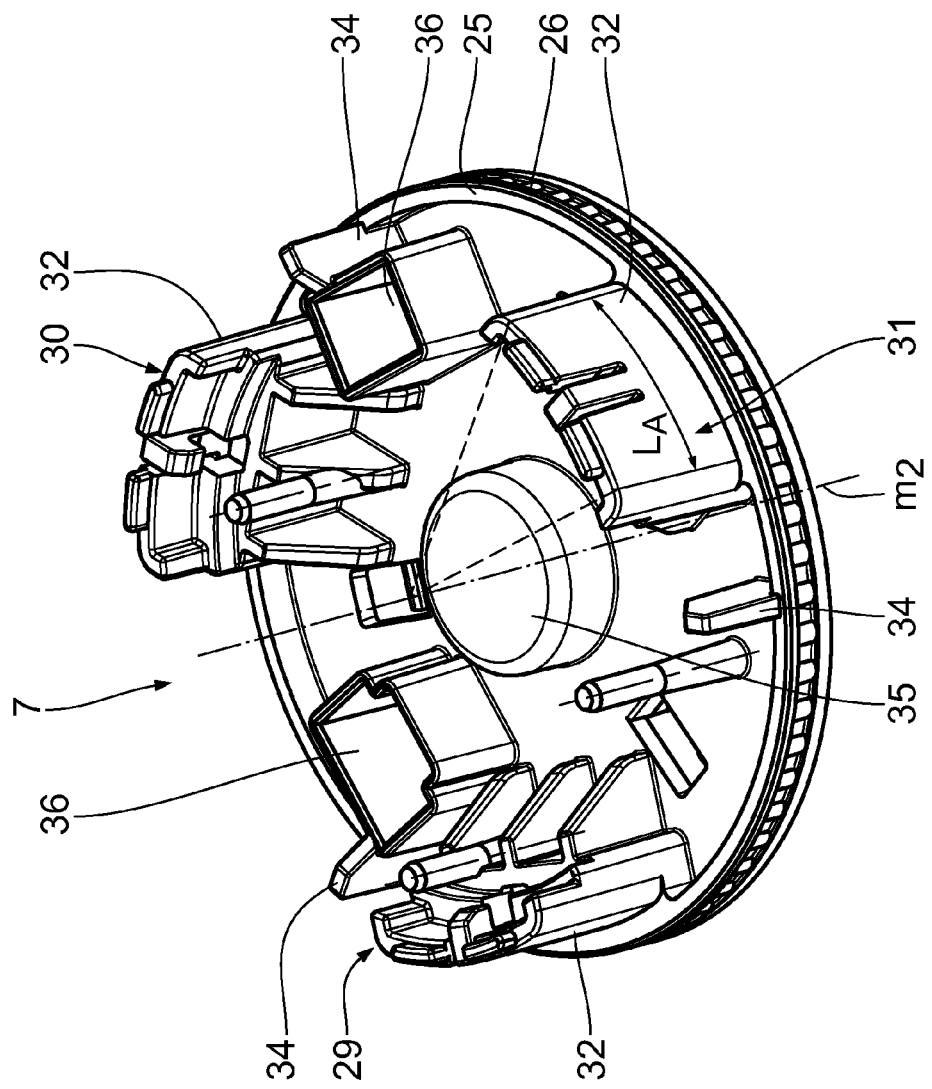
FIG. 3 shows a perspective view of a second casing part of the insert casing in FIG. 1.

In the following sections, a first exemplary embodiment of the invention will be described with reference to FIGS. 1 to 7. An object 1 configured as a piece of furniture has a base body 2 in which a recess 3 is formed. The recess 3 has a circular cross-section and has a central longitudinal axis M, wherein a base body side wall 4 bounding the recess 3 has a distance R from said central longitudinal axis M. The recess 3 is configured as a blind hole.

The recess 3 is adapted to allow installation of an insert casing 5. The insert casing 5 includes a first casing part 6 and a second casing part 7 which define a receiving space 8. The receiving space 8 is adapted to receive an electrical or electronic component 9 which is outlined only in FIGS. 5 and 7.

The first casing part 6 has a bottom 10 with an annular side wall 11 being mounted thereto. The first casing part 6 has a central longitudinal axis $m_1$, wherein the inner side of the side wall 11 is arranged at a distance $r_G$ from said central longitudinal axis $m_1$ while the outer side of the side wall 11 is arranged at a distance $R_G$ therefrom. The casing parts 6, 7 are connectable with each other by means of a rotary joint 12. To this end, the first casing part 6 is provided with an internal thread 13 at an end of the side wall 11 remote from the bottom 10.

In order to secure the insert casing 5 in the associated recess 3, the first casing part 6 is provided with three spreading members 14 to 16. The spreading members 14 to 16 are formed in the side wall 11 between the bottom 10 and the internal thread 13. Seen in the circumferential direction, the spreading members 14 to 16 are evenly distributed around the central longitudinal axis $m_1$, in other words they have an angular separation of 120° relative to the central longitudinal axis $m_1$. Each of the spreading members 14 to 16 has a first end 17 which is formed in one piece with the side wall 11. Starting from the respective first end 17, the spreading members 14 to 16 extend around the central longitudinal axis $m_1$ in the circumferential direction and are each provided with a free second end 18. The spreading members 14 to 16 are thus formed by a respective U-shaped breakthrough 19 in the side wall 11. The spreading members 14 to 16 are formed in one piece with the first casing part, strictly speaking the side wall 11 thereof, so as to be resiliently mounted thereto. Due to their design and arrangement, the spreading members 14 to 16 are spreadable, in other words deflectable, relative to the central longitudinal axis $m_1$.

Each of the spreading members 14 to 16 has an inner wall 20 facing the receiving space 8 and an outer wall 21 remote from the receiving space 8. The inner walls 20 are smooth. The outer walls 21 have a distance or outer radius $R_S$ from the central longitudinal axis $m_1$ which corresponds to the distance or outer radius $R_G$ when the spreading members 14 to 16 are not deflected, in other words not spread. Furthermore, each of the inner walls 20 has a distance or inner radius $r_S$ from the central longitudinal axis $m_1$ which is not constant but tapers from the first end 17 of the respective spreading member 14 to 16 to the associated second end 18 thereof. In other words, the inner walls 20 of the spreading members 14 to 16 taper in the direction of their respective free ends 18. At the first ends 17, the inner radius $r_S$ is slightly smaller than the distance or inner radius $r_G$, with $r_S \approx 0.97\ r_G$. In contrast thereto, the inner radius $r_S$ at the free ends 18 of the respective spreading member 14 to 16 is such that $r_S \leq 0.96\ r_G$, in particular $r_S \leq 0.93\ r_G$, and in particular $r_S \leq 0.90\ r_G$. As a result, the spreading members 14 to 16 have a wall thickness w where $w = R_S - r_S$. The wall thickness w radially increases in the direction of the respective free end 18 of the spreading members 14 to 16.

The outer walls 21 of the spreading members 14 to 16 are provided with grooves 22 extending in the circumferential direction such that the outer walls 21 form ribs 23 that extend in the circumferential direction. In other words, the outer walls 21 are provided with a profile. The free ends 18 of the spreading members 14 to 16 are further provided with several barbs 24 which are arranged at the outer walls 21 as well to ensure secure fastening. The barbs 24 are part of the profile.

The casing parts 6, 7 are configured such that the spreading members 14 to 16 are spread, in other words deflected outwardly, by the second casing part 7 when closing the rotary joint 12. The second casing part 7 has a substantially disk-shaped lid 25 with a central longitudinal axis $m_2$. In order to close the rotary joint 12, the lid 25 is provided with an external thread 26 at its circumference which is adapted to be screwed into the associated internal thread 13 by means of a rotary movement about the central longitudinal axis $m_2$. The rotary joint 12 is configured such that in order to close the rotary joint 12, the second casing part 7 needs to be rotated relative to the first casing part 6 in a closing direction 27 which extends from the first ends 17 of the spreading members 14 to 16 to the free ends 18 thereof. Conversely, an opening direction 28 extends from the free ends 18 of the spreading members 14 to 16 to the first ends 17 thereof.

In order to spread the spreading members 14 to 16, a number of contact members 29 to 31 are arranged at the inner side of the lid 25 facing the receiving space 8, the number corresponding to the number of spreading members 14 to 16. The contact members 29 to 31 are arranged around the central longitudinal axis $m_2$ such as to be evenly spaced from each other when seen in the circumferential direction, in other words they have an angular distance of 120° from each other. Each of the contact members 29 to 31 has an outer wall 32 which has a distance or outer radius $R_A$ from the central longitudinal axis $m_2$ that corresponds to the inner radius $r_S$ at the ends 17 of the spreading members 14 to 16. In other words, the outer walls 32 are curved, wherein the radius of curvature corresponds to the inner radius $r_S$ at the free ends 17 so that the contact members 29 to 31 abut against the associated spreading members 14 to 16. The contact members 29 to 31 have a length $L_A$ in the circumferential direction, wherein the ratio of said length $L_A$ to a length $L_S$ of the spreading members 14 to 16 is such that $L_A/L_S \geq 0.5$, in particular $L_A/L_S \geq 0.6$, and in particular $L_A/L_S \geq 0.7$. This causes the spreading members 14 to 16 to be spread by the associated contact members 29 to 31 across a large surface area, with the contact members 29 to 31 exerting a contact pressure in the radial direction that extends across a large surface area.

In order to stop the rotary movement of the casing parts 6, 7 relative to each other when in the spread position, the casing part 6 is provided with stops 33 while the casing part 7 is provided with corresponding counter stops 34. The stops 33 are configured as webs arranged at the side wall 11 in the receiving space 8. The stops 33 are substantially parallel to the central longitudinal axis $m_1$. Furthermore, the stops 33 are arranged at the side wall 11 such as to be adjacent to the first ends 17 of the spreading members 14 to 16. The stops 33 are formed in one piece with the side wall 11. The distance $R_t$ of the stops 33 from the central longitudinal axis $m_1$ substantially corresponds to the distance $r_S$ at the ends 17 of the spreading members 14 to 16.

The counter stops 34 are arranged on the inside of the lid 25. The counter stops 34 are configured as webs extending substantially in the direction of the central longitudinal axis $m_2$. The counter stops 34 are spaced from the central longitudinal axis $m_2$ such that they overlap with the stops 33. The counter stops 34 have a maximum distance $R_T$ from the central longitudinal axis $m_2$ which corresponds to the inner radius $r_G$ of the first casing part 7.

In order to close and open the rotary joint 12, a tool engagement member 35 is arranged on an outside of the casing part 7 remote from the receiving space 8. The tool engagement member 35 is arranged concentrically to the central longitudinal axis $m_2$. The tool engagement member 35 is configured as a recess which may have a hexagonal shape. The second casing part 7 is further provided with several through-openings 36 which lead into the receiving space 8. The through openings 36 are adapted to lead cable connections (not shown in more detail) for the electrical or electronic component 9 into the receiving space 8.

The functioning of the insert casing 5 is as follows:

In a first step, the electrical or electronic component 9 is arranged in the receiving space 8, and the cable connections are led through the through-openings 36. Afterwards, the second casing part 7 is arranged on the first casing part 6, with the rotary joint 12 still being open. The central longitudinal axes $m_1$ and $m_2$ are congruent. The second casing part 7 is provided with a first marking 37 allowing the second casing part 7 to be arranged on the first casing part 6 in a desired position.

Figure 4:
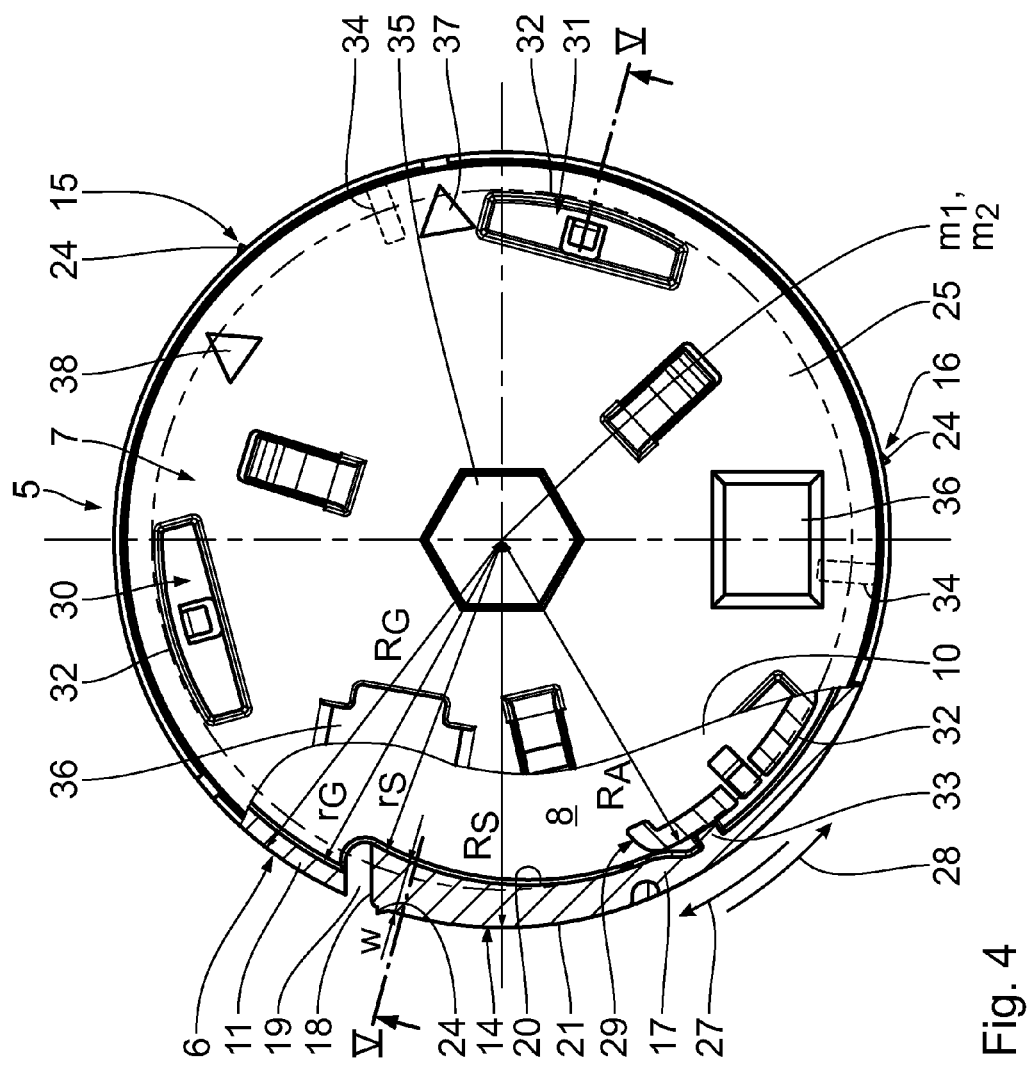
FIG. 4 shows a partly cut plan view of the insert casing according to FIG. 1 when prepared for installation.
Figure 5:
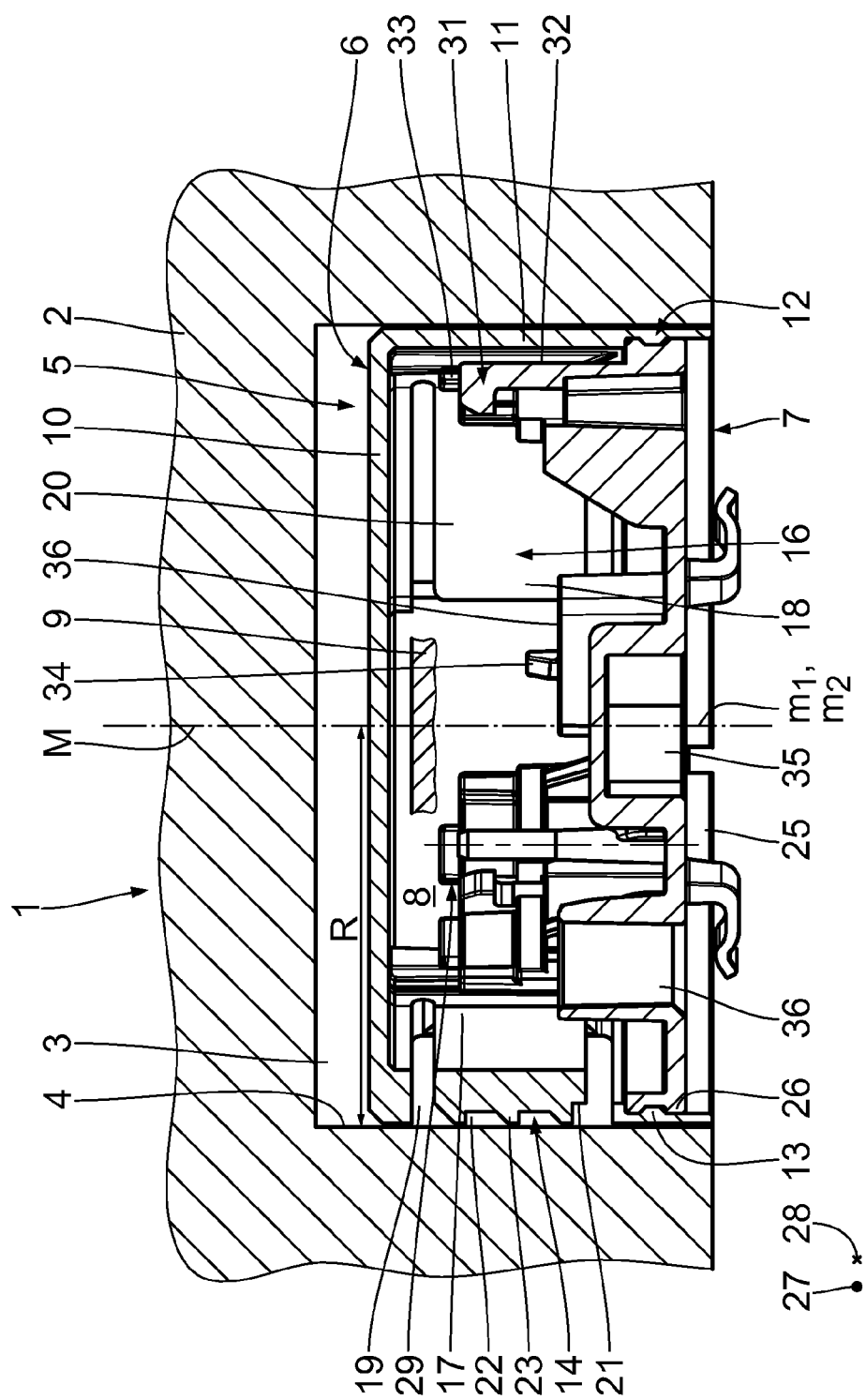
FIG. 5 shows an axial sectional view of the insert casing along section line V-V in FIG. 4.

The insert casing 5 with the electrical or electronic component 9 received therein is now arranged in the recess 3. To this end, the radius R of the recess 3 is slightly greater than the outer radius $R_G$ of the casing. FIGS. 4 and 5 are illustrations of the open insert casing 5, in other words the spreading members 14 to 16 thereof are not deflected outwardly.

In order to close the rotary joint 12, the tool engagement member 35 is engaged by a tool for the second casing part 7 to be rotated about the central longitudinal axis $m_1$ and $m_2$ in the closing direction 27. In order to prevent the first casing part 6 from co-rotating in the recess 3, the barbs 24 protrude slightly beyond the side wall 11 as long as the spreading members 14 to 16 are in the non-spread position, allowing said barbs 24 to engage the base body side wall 4. The insert casing 5 is easily introducible into the recess 3 despite the presence of the barbs 24 as the spreading members 14 to 16 are resilient and displaceable in the direction of the receiving space 8 by the small amount of the protrusion of the barbs 24.

Figure 6:
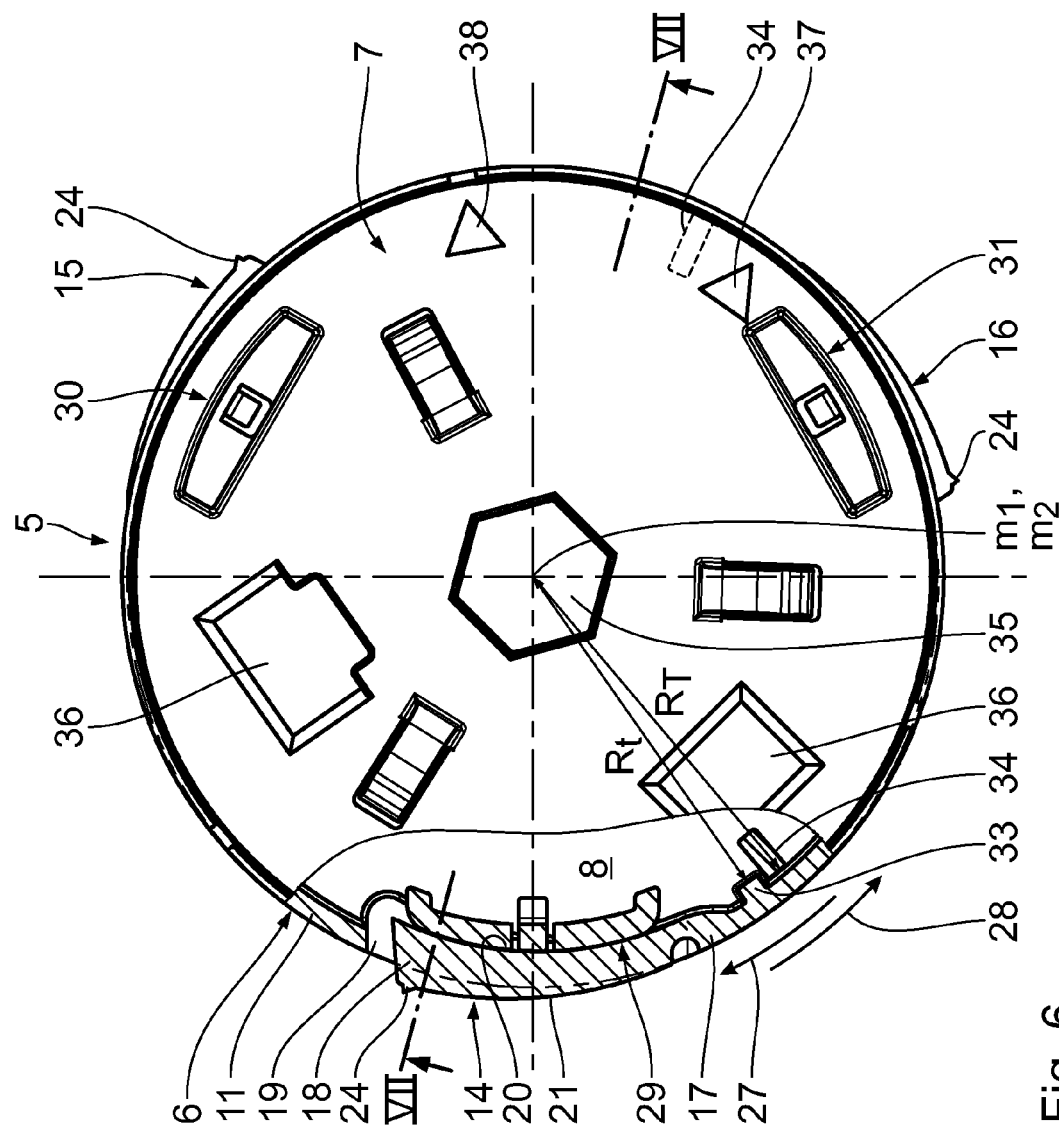
FIG. 6 shows a partly cut plan view of the insert casing according to FIG. 1 when fastened.
Figure 7:
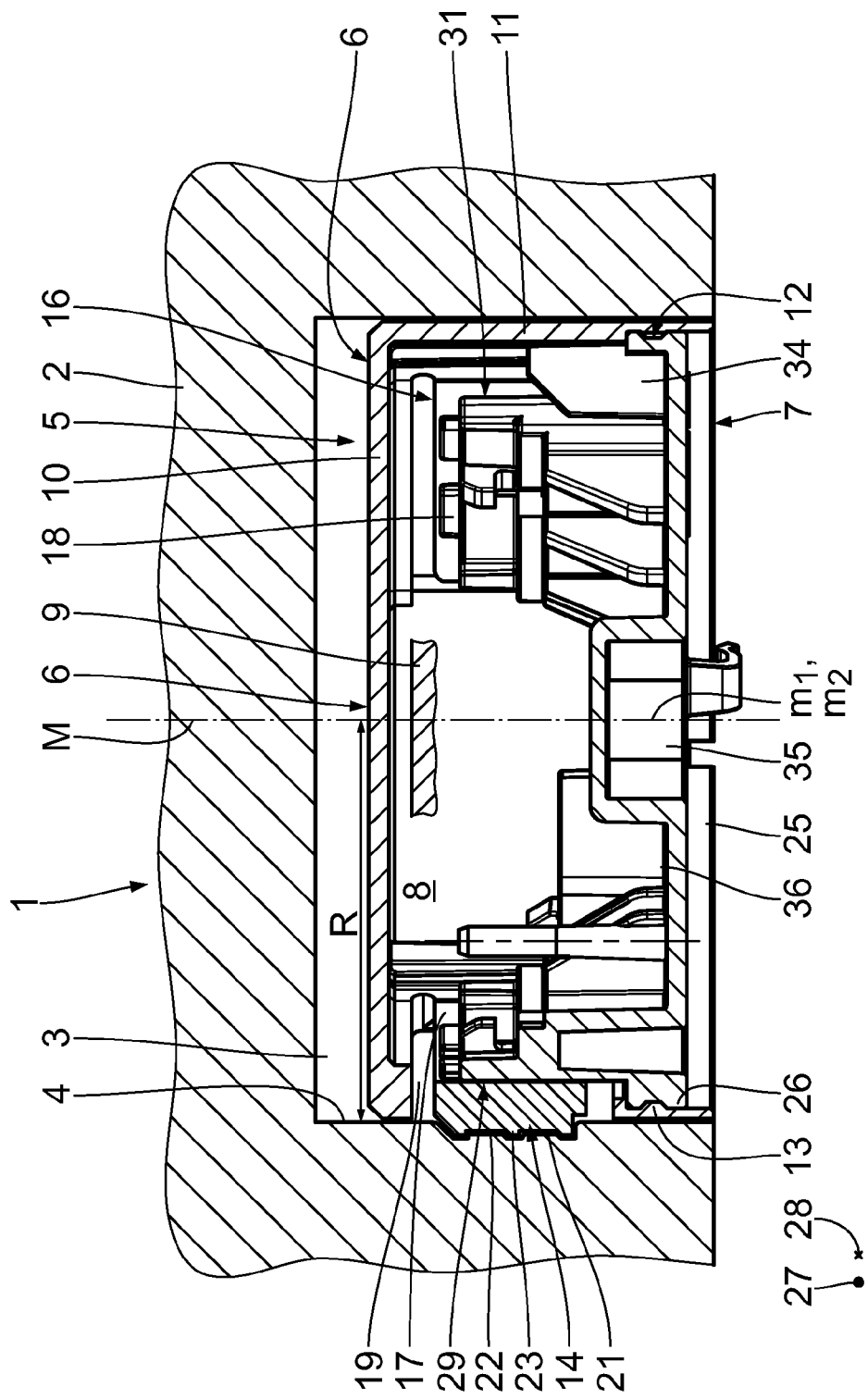
FIG. 7 shows an axial sectional view of the insert casing along section line VII-VII in FIG. 6.

The rotary movement of the casing parts 6, 7 causes the rotary joint 12 to be closed such that the casing parts 6, 7 are connected with each other. As the second casing part 7 is provided with the contact members 29 to 31, said contact members 29 to 31 are displaced in the direction of the free ends 18 of the spreading members 14 to 16 when said rotary movement is performed. When the contact members 29 to 31 are being displaced, the outer walls 32 thereof abut against the associated inner walls 20 of the spreading members 14 to 16. Due to the fact that the inner walls 20 taper in the closing direction 27 and therefore protrude into the receiving space 8, the spreading members 14 to 16 are deflected in the radial direction when the rotary movement is performed. FIGS. 6 and 7 show the insert casing 5 with its spreading members 14 to 16 in the deflected, in other words spread, position. The spreading members 14 to 16 are spread to such an extent that the outer radius thereof is greater than the outer radius R of the recess 3. The outer walls 21 of the spreading members 14 to 16 are pressed with their profile, in other words the grooves 22 and associated ribs 23 as well as the barbs 24, into the material of the base body 2. The ribs 23 extending in the circumferential direction ensure that the insert casing 5 is secured in particular in the direction of the central longitudinal axis $m_1$ and $m_2$.

The rotary movement of the casing parts 6, 7 comes to a stop when the stops 33 and associated counter stops 34 come to abut against each other. When this happens, the outer walls 32 of the contact members 29 to 31 are in a surface-to-surface contact with the inner walls 20 of the associated spreading members 14 to 16. The second casing part 7 is provided with a second marking 38 to indicate the spread position of the spreading members 14 to 16.

To conclude, when closing the rotary joint 12, the casing parts 6, 7 are on the one hand connected to each other and the spreading members 14 to 16 are at the same time deflected, thus providing a simple manner of securing the insert casing 5 in the recess 3 of the object 1. As a result, the insert casing 5 can be fastened easily and securely.

In order to dismount the insert casing 5, the tool engagement member 35 is again engaged by a tool so as to rotate the second casing part 7 relative to the first casing part 6 in the opening direction 28. The deflected spreading members 14 to 16 ensure that the first casing part 6 is securely fixed when the rotary movement is performed. The rotary movement in the opening direction 28 causes the contact members 29 to 31 to be moved away from the spreading members 14 to 16, with the resilient nature of the spreading members 14 to 16 allowing the spreading members 14 to 16 to revert to their originally non-spread position. The secure connection of the insert casing 5 with the recess 3 is thus released. The connection between the casing parts 6, 7 is at the same time released as well. Dismounting the insert casing 5 is thus equally simple. The casing parts 6, 7 may each be made in one piece of plastic material. The casing parts 6, 7 have a comparatively simple design and are easy to manufacture.

The insert casing 5 is for instance adapted to receive and secure an electronic component 9 for the wireless charging of mobile telephones. To this end, the insert casing 5 is for instance fastened to a piece of furniture, in particular a table.

Figure 8:
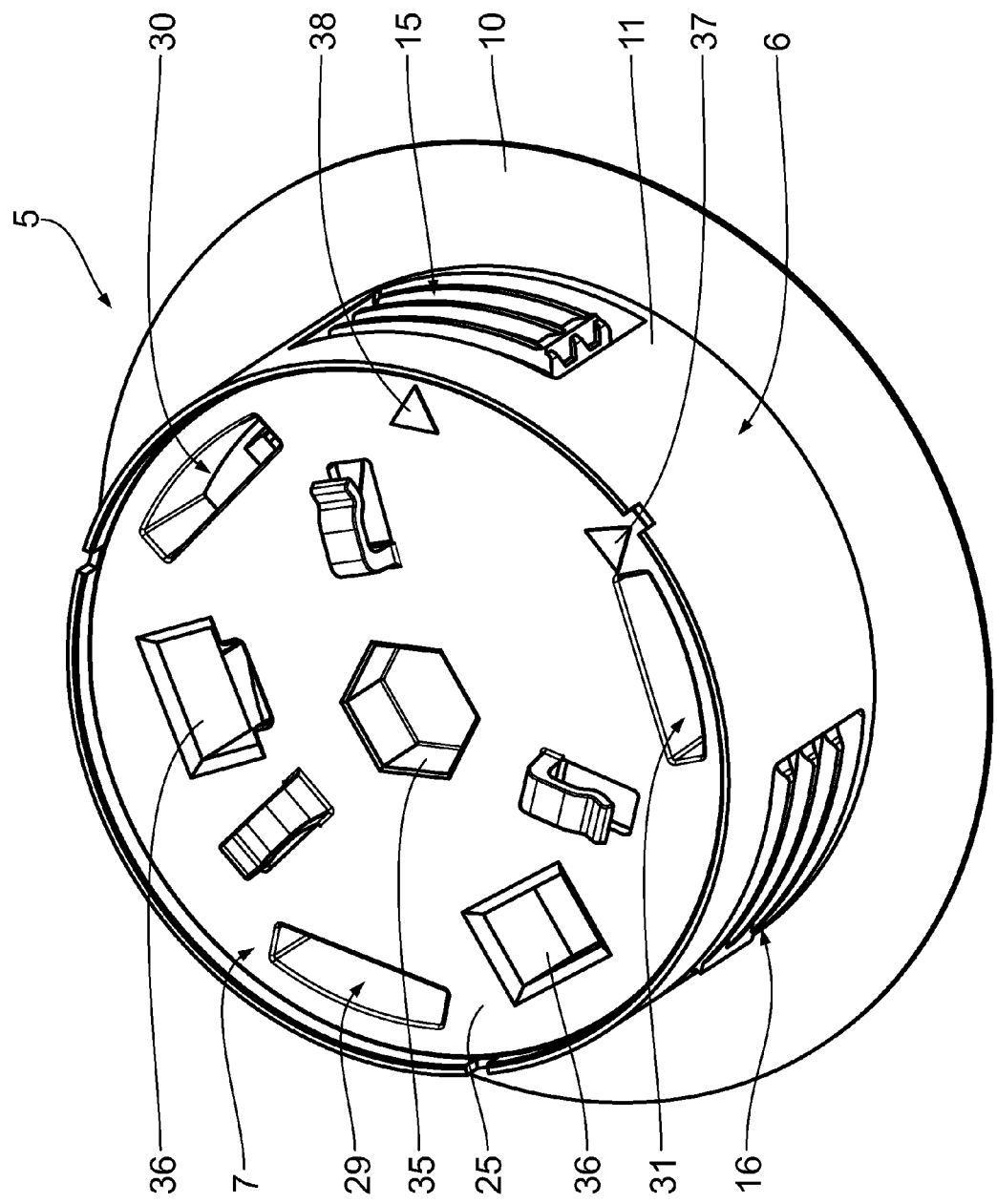
FIG. 8 shows a perspective view of an insert casing according to a second exemplary embodiment.

The following section describes a second exemplary embodiment of the invention with reference to FIG. 8. In contrast to the first exemplary embodiment, the bottom 10 of the first casing part 6 protrudes beyond the side wall 11 in the radial direction so as to form a rim. This embodiment is advantageous if the recess 3 is configured as a through-hole. The rim formed by the bottom 10 then covers the recess 3 completely. Details concerning the further design and functioning of the insert casing 5 can be found in the description of the first exemplary embodiment.

Having thus described the device, various modifications and alterations will occur to those skilled in the art, which modifications and alterations are intended to be within the scope of the device as defined by the appended claims.

What is claimed is:

1. An insert casing for receiving and fastening an electrical component, the insert casing comprising:
    a first casing part having a central longitudinal axis ($m_1$) and a second casing part having a central longitudinal axis ($m_2$) connectable to the first casing part; and,
    a receiving space defined by the casing parts for receiving an electrical component;
    wherein:
    the casing parts form a rotary joint;
    at least one spreading member is formed on the first casing part; and, the at least one spreading member is spreadable radially outward relative to the central longitudinal axis ($m_1$) and out of the receiving space by rotation of the second casing part about the central longitudinal axis ($m_2$) when the rotary joint is closed.

2. An insert casing according to claim 1 further comprising:
    the first casing part having an annular side wall around the central longitudinal axis ($m_1$); and,
    the at least one spreading member is formed on said annular side wall.

3. An insert casing according to claim 1 further comprising:
    the at least one spreading member is formed in one piece in the first casing part.

4. An insert casing according to claim 1 further comprising:
    the at least one spreading member is mounted resiliently on the first casing part.

5. An insert casing according to claim 2, further comprising:
    the at least one spreading member having a first end extending from the first casing part and a free second end; and,
    the at least one spreading member having a wall thickness (w) that increases radially in the direction of the second end.

6. An insert casing according to claim 2 further comprising:
    the at least one spreading member having an inner wall with an inner radius $r_s$ facing the receiving space; and,
    the inner radius $r_s$ tapering in the direction of a free end of the at least one spreading member.

7. An insert casing according to claim 2 further comprising:
    the at least one spreading member having an outer wall with an outer radius $R_s$ remote from the receiving space; and,
    the outer radius $R_s$ corresponding to an outer radius $R_G$ of the side wall.

8. An insert casing according to claim 1 further comprising:
    the at least one spreading member being provided with a profile at an outer wall remote from the receiving space for fastening the first casing part in a recess of an object.

9. An insert casing according to claim 8 further comprising:
    the profile comprising ribs running around the central longitudinal axis ($m_1$).

10. An insert casing according to claim 1 further comprising:
    at least two spreading members formed on the first casing part.

11. An insert casing according to claim 10 further comprising:
    at least three spreading members formed on the first casing part.

12. An insert casing according to claim 10 further comprising:
    the spreading members arranged around the central longitudinal axis ($m_1$) such as to be evenly spaced from each other.

13. An insert casing according to claim 1 further comprising:
    the casing parts having at least one stop and an associated counter-stop for stopping a rotary movement of the casing parts relative to each other when the at least one spreading member is spread open.

14. An insert casing according to claim 1 further comprising:
    the second casing part having at least one contact member for spreading the at least one spreading member.

15. An insert casing according to claim 14 further comprising:
    a length $L_A$ of the at least one contact member relative to a length $L_s$ of the at least one spreading member is such that $L_A/L_s \geq 0.5$.

16. An insert casing according to claim 1 further comprising:
    at least one of the casing parts being provided with a tool engagement member.

17. An insert casing according to claim 16 further comprising:
    the tool engagement member being arranged concentrically to the central longitudinal axis ($m_1$, $m_2$).

18. An insert casing according to claim 1 further comprising:
    at least one of the casing parts having at least one through-opening into the receiving space.

19. An insert casing according to claim 18 further comprising:
    the at least one through-opening being formed in the casing part a the tool engagement member.

20. A method for fastening an insert casing to an object, the method comprising the following steps:
    providing an insert casing;
    arranging a first casing part having a central longitudinal axis ($m_1$) in a recess of an object;
    connecting a second casing part having a central longitudinal axis ($m_2$ with the first casing part to form a rotary joint; and,
    rotating the second casing part about the central longitudinal axis ($m_2$) and relative to the first casing part to close the rotary joint, wherein the second casing part spreads at least one spreading member and fastens the insert casing in the recess.

21. An insert casing for receiving and fastening an electrical component comprising:
    a first casing part having a central longitudinal axis ($m_1$) and a second casing part having a central longitudinal axis ($m_2$) connectable to the first casing part; and
    a receiving space defined by the casing parts for receiving an electrical component;
    wherein the first and second casing parts form a rotary joint;
    at least one spreading member is formed on the first casing part; and the at least one spreading member is spreadable by the second casing part when the rotary joint is closed by rotating the second casing part relative to the first casing part to fasten the insert casing in a recess of an object.

\* \* \* \* \*